United States Patent [19]

Krogmann

[11] Patent Number: 5,212,658
[45] Date of Patent: May 18, 1993

[54] FILTER FOR OBTAINING A USEFUL SIGNAL, CONSTANT WITH RESPECT TO TIME, FROM A NOISY MEASURING SIGNAL

[75] Inventor: Uwe Krogmann, Überlingen-Nussdorf, Fed. Rep. of Germany

[73] Assignee: Bodenseewerk Gerätetechnik GmbH, Fed. Rep. of Germany

[21] Appl. No.: 424,534

[22] Filed: Oct. 20, 1989

[30] Foreign Application Priority Data

Oct. 22, 1988 [DE] Fed. Rep. of Germany ....... 3836115

[51] Int. Cl.$^5$ .............................................. G06F 7/38
[52] U.S. Cl. .................................... 364/572; 364/574; 328/167
[58] Field of Search ........... 364/574, 572, 573, 724.01, 364/825, 570, 149–151, 571; 324/76 A; 328/167; 307/520

[56] References Cited

U.S. PATENT DOCUMENTS

| | | | |
|---|---|---|---|
| 3,953,793 | 4/1976 | Nilsson | 324/76 A |
| 4,035,734 | 7/1977 | Flormann et al. | 328/167 |
| 4,071,744 | 1/1978 | Pollock | 364/570 X |
| 4,195,337 | 3/1980 | Bertrand et al. | 364/151 |
| 4,471,447 | 9/1984 | Williams et al. | 364/151 |
| 4,587,620 | 5/1986 | Niimi et al. | 364/574 |
| 4,837,720 | 6/1989 | Rambaut | 364/574 |
| 4,841,461 | 6/1989 | Yamamoto et al. | 328/167 |
| 4,959,656 | 9/1990 | Kumar | 342/418 |
| 4,987,684 | 1/1991 | Andrews et al. | 33/340 |

FOREIGN PATENT DOCUMENTS

2441926B2 2/1974 Fed. Rep. of Germany .
3040753A1 10/1982 Fed. Rep. of Germany .

OTHER PUBLICATIONS

Paper by Williams S. Cooper entitled: "Use of Optimal Estimation Theory, In Particular the Kalman Filter, In Data Analysis and Signal Processing"; Oct. 1986.

Primary Examiner—Parshotam S. Lall
Assistant Examiner—Michael Zanelli
Attorney, Agent, or Firm—Lee, Mann, Smith, McWilliams, Sweeney & Ohlson

[57] ABSTRACT

A filter for obtaining a useful signal, constant with respect to time, from a noisy measuring signal, having a measuring signal integrator and an optimal estimator (54) which represents a model of the integrated measuring signal and to which the difference of the integrated measuring signal, and an estimate of the integrated mesuring signal resulting from the model, is applied, for estimating that coefficient of the model, which corresponds to a linear signal rise.

3 Claims, 7 Drawing Sheets

FILTER FOR OBTAINING A USEFUL SIGNAL, CONSTANT WITH RESPECT TO TIME, FROM A NOISY MEASURING SIGNAL

TECHNICAL FIELD

The invention relates to a filter for obtaining a useful signal, constant with respect to time, from a noisy measuring signal having means for integrating the measuring signal.

In the technology of signal filtering, the problem often arises to filter out a constant useful signal from a very noisy measuring signal. In addition to white noise the measuring signal often also contains harmonic components. Furthermore, the noise sometimes has very low frequency components. The available measuring time is relatively short in many cases.

BACKGROUND ART

As classic filtering methods low-pass filters having constant coefficients, are known for obtaining the useful signal. However, these low-pass filters do not give any useful filtering in case of very low frequency noise and short measuring time.

In the book by A. Gelb "Applied Optimal Estimation", pp. 124 to 126, an optimal filter is described, in which the difference of the measuring signal and an estimate of the measuring signal is integrated with a factor varying according to a certain function of time, the integral supplying said estimate of the measuring signal. Such type of filtering supplies improved results as compared to the conventional filtering methods.

DE-B-24 41 926 describes a method for determination of signals influenced by disturbances, in which the signals are integrated and the integration value obtained during an integration time is divided by the integration time and indicated or further processed in some other way. The integration time is made dependent on a stabilization of the indicated value.

DE-A-30 40 753 describes a method for the determination of a direct voltage superimposed by a disturbing alternating voltage, in which the voltage to be determined is integrated. Therein, the integration is effected between defined phases of the disturbing alternating voltage.

DISCLOSURE OF INVENTION

It is the object of the invention to achieve a further improved filtering of noisy measuring signals. In particular, low frequency noise and harmonic disturbances shall also be filtered. The measuring time shall be reduced.

According to the invention this object is achieved by an optimal estimator which represents a model of the integrated measuring signal and to which the difference of the integrated measuring signal and an estimate of the integrated measuring signal resulting from the model is applied, for estimating that coefficient of the model, which corresponds to a linear signal rise.

By the integration the constant component of the measuring signal, which represents the actual useful signal, is amplified as compared to the higher frequency noise. The amplitude of harmonic components is reduced. However, with the integration of harmonic components a constant component results as a rule, in the integrated signal, this component depending on the phase of the harmonic component relative to the integration interval. Usually the integration is not carried out over an integral number of complete waves.

Therefore, a constant coefficient of zero order representing a constant component due to harmonic components is provided in the model of the integrated measuring signal. A coefficient of first order represents the looked-for constant useful signal which results in a ramp of the estimate in the integration. Furthermore, the model comprises the measuring noise. With regard to the measuring noise there are no particular conditions such as average freedom with standard distribution. An average of the measuring noise would be taken into consideration by the coefficients of first order.

Modifications of the invention are subject matter of the sub-claims.

An embodiment of the invention will now be described in greater detail with reference to the accompanying drawings.

PREFERRED EMBODIMENTS OF THE INVENTION

Figure 1:
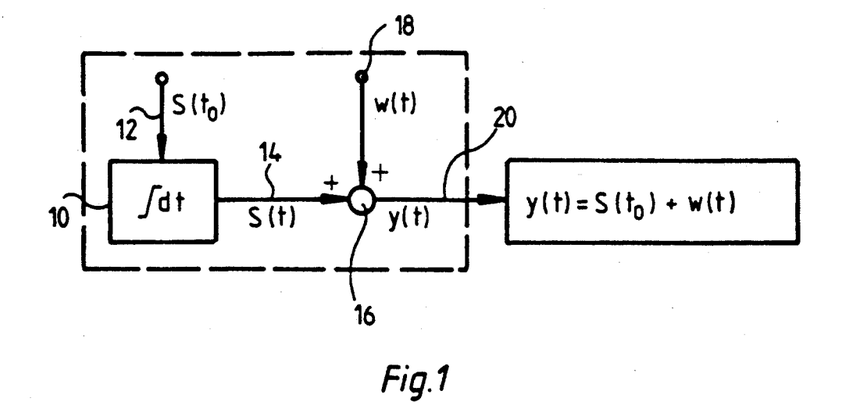
FIG. 1 illustrates the signal process model.

The signal process model for a constant useful signal $S(t_o)$ is illustrated in FIG. 1. The constant useful signal is symbolized by an integrator 10 (as memory) to which the constant useful signal $S(t_o)$ is applied as initial value to an input 12. The integrator 10 supplies this constant signal as output signal $S(t)$ to an output 14. In a summing point 16 the noise $w(t)$ which is applied to an input 18 is superimposed to the useful signal. A measuring signal $y(t)$ results at an output 20. It is $$y(t) = S(t_o) + w(t).$$

Figure 2:
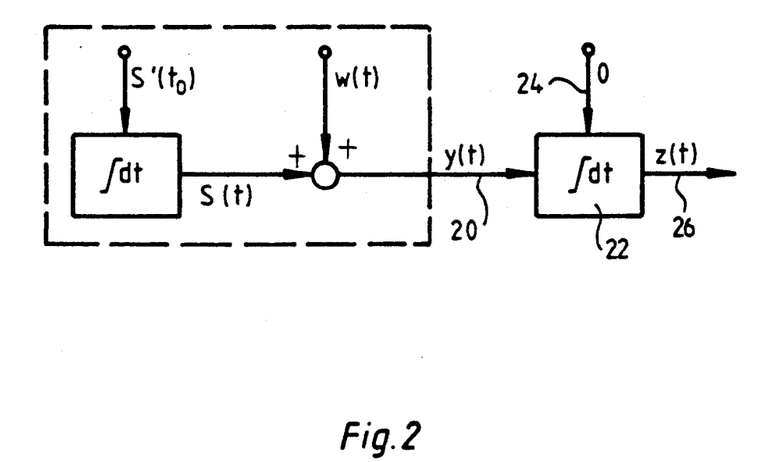
FIG. 2 shows the signal process model after integration.

In contrast thereto FIG. 2 shows the signal process model for the integrated measuring signal. The measuring signal results in the same way as illustrated with reference to FIG. 1. The measuring signal $y(t)$ from the output 20 is applied to an integrator 22. The value "0" is selected as initial value at an input 24 of the integrator 22. The integrated measuring signal $$z(t) = a_o + a_1 t + v(t)$$

results at an output 26 of the integrator 22. The integrated measuring signal z(t) contains a constant term $a_o$ as a coefficient of zero order. This constant term takes into consideration, for example, that the integration of a harmonic signal results in a constant residual quantity depending on the phase relation. It also takes into consideration a possible finite average of the noise. The coefficient of first order $a_1$ represents the constant useful signal. The useful signal is amplified by the integration. The influence of harmonic components in the measuring signal is reduced except for the constant term $a_o$. Noise components are suppressed.

Figure 3:
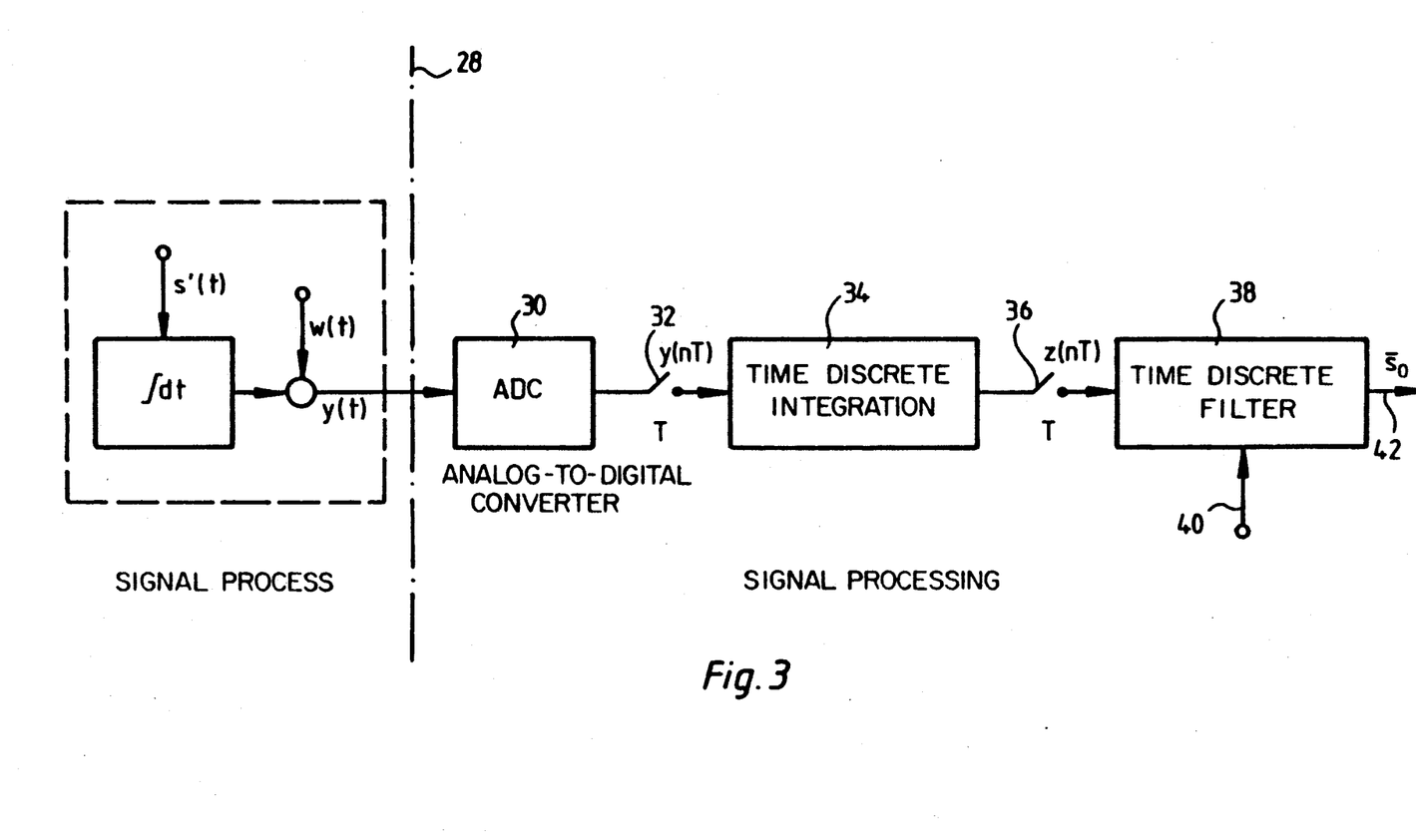
FIG. 3 is a block diagram of the signal process and the signal processing in the filter.

FIG. 3 shows the general structure of the signal processing. The signal process model is illustrated to the left of the dot-dash line 28 and corresponds to FIG. 1. The measuring signal is converted into a digital signal by an analog-to-digital converter 30. The signal is sampled with a clock interval T and, as indicated by a switch 32, is subjected as signal y(nT) to an integration of discrete values in time. This integration of discrete values in time is illustrated by the block 34. Herein "n" is the serial number of the clock interval. "T" is the clock interval. The integration of discrete values in time according to block 34 correspondingly results in the integrated measuring signal z(nT), likewise in a clock interval with the clock interval T as indicated in FIG. 3 by the switch 36. The integrated measuring signal z(nT) is applied to a filter 38 operating on discrete values in time. Information about the measuring accuracy is supplied to the filter 38, which is illustrated by an input 40. It supplies an estimate $S_o$ for the constant useful signal $S(t_o)$ at an output 42.

Figure 4:
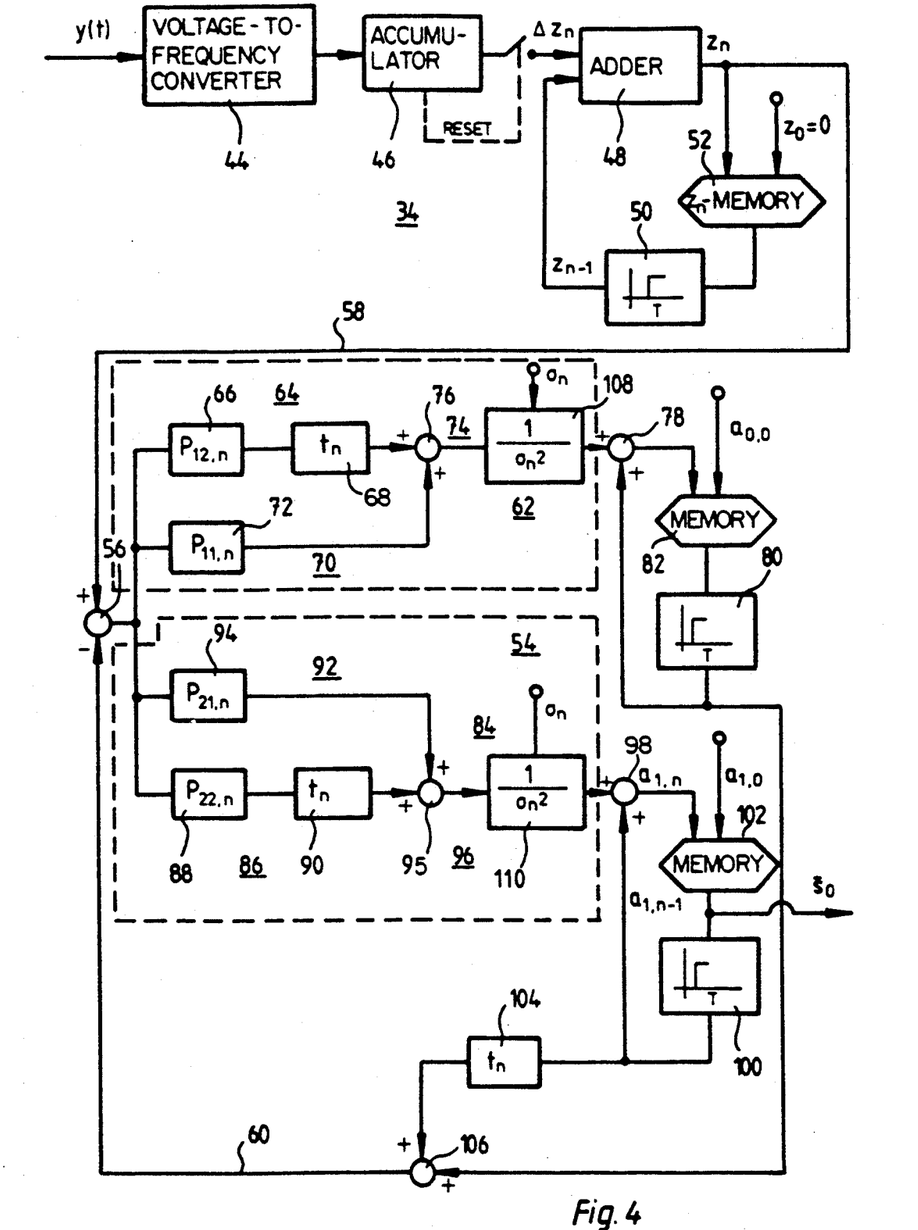
FIG. 4 shows a type of the realization of the signal processing with a filter of discrete values in time.

FIG. 4 shows an embodiment for the signal processing.

The means for integrating the measuring signal y(t) comprise a voltage-to-frequency converter 44. The voltage-to-frequency converter 44 converts the measuring signal y(t) into a frequency proportional thereto, this frequency being high relative to the clock frequency. The output signals from the voltage-to-frequency converter 44 are applied to an accumulator 46 which is arranged to be reset at predetermined clock intervals, namely at intervals of time T. The contents, z of the accumulator 46 is applied as one summand at said predetermined clock intervals and the contents of a memory 52 is applied with delay of one clock interval, illustrated by block 50, to adding means 48. The output $z_n$ of the adding means 48 is read into the memory 52. The output $z_n$ of the adding means 48 provides digitally the integral of the measuring signal.

The filter 38 (FIG. 3) comprises an optimal estimator 54. At a summing point 56, the optimal estimator 54 receives the output $z_n$ of the adding means 48 as illustrated by line 58. Furthermore, the estimate of the integrated measuring signal is applied to the summing point 56. This is illustrated by line 60. This estimate is obtained in a way still to be described.

The optimal estimator 54 comprises a first channel 62. The first channel 62 has means 64 for multiplying the difference formed at the summing point 56 of integrated measuring signal $z_n$ and estimate of the integrated measuring signal with a first time-variant factor $P_{12;n}$, illustrated by block 66, and the time $t_n$ (=nT) of the clock interval concerned, illustrated by block 68. Furthermore, the first channel 64 comprises means 70 for multiplying the difference of integrated measuring signal and estimate of the integrated measuring signal by second time-variant factor $P_{11;n}$, illustrated by block 72. Means 74 are provided for adding the two products thus obtained, as illustrated by a summing point 76, and forming a variation signal representing a variation of a zero coefficient $a_o$. The variation signal thus obtained is applied as one summand, and the contents $a_{o,n-1}$ of a second memory 82 is applied as the other summand with delay of one clock interval, illustrated by block 80, to zero adding means 78. Therein, the output $a_{o,n}$ of the zero adding means 78 are adapted to be read into the memory 82. The contents, that means $a_{o,n-1}$ of the second memory 82 delayed by one clock interval, as illustrated by block 80, forms the zero coefficient of the model.

The optimal estimator 54 comprises a second channel 84. The channel 84 has means 86 for multiplying the difference of integrated measuring signal and estimate of the integrated measuring signal by a third time-variant factor $P_{22;n}$, illustrated by block 88, and the time $t_n$ of the clock interval concerned, illustrated by block 90. Furthermore, means 92 for multiplying the difference of integrated measuring signal and estimate of the integrated measuring signal by a fourth time-variant factor $P_{21;n}$, illustrated by block 94, are provided in the channel 84. Means 96 are provided for adding the two products thus obtained and for forming a first variation signal representing a variation of a first coefficient. The summing of the products is effected at a summing point 97. Similarly as in the first channel 62, the first variation signal thus obtained is applied as one summand, and the contents of a third memory 102 is applied as the other summand $a_{1;n-1}$ with delay of one clock interval, illustrated by block 100, to first adding means 98. The output $a_{1;n}$ of the first adding means 98 is read into the memory 102. The contents of the third memory 102 delayed by one clock interval forms the first coefficient of the model. Means 104 for multiplying said first coefficient by the time $t_n$ of the clock interval concerned are now provided in the second channel 84.

Means illustrated by the summing point 106 are provided for adding the zero coefficient and the first coefficient multiplied by the time $t_n$ of the clock interval for forming an estimate of the measuring quantity. Said first coefficient provides an estimate of the constant useful signal.

The means 74 for forming the zero variation signal and the means 96 for forming the first variation signal can comprise means 108 and 110, respectively, for dividing the sum obtained from the adding means 76 by the variance of the measuring noise. However, also a weighting signal can be supplied, as, for example, described in the patent application "Filter Arrangement for Generating an Estimate of a Measured Variable Influenced by Disturbances" filed by Detler Wick and Hans Jörg Senn (claiming priority of German patent application P 38 36 417.4).

Figure 5:
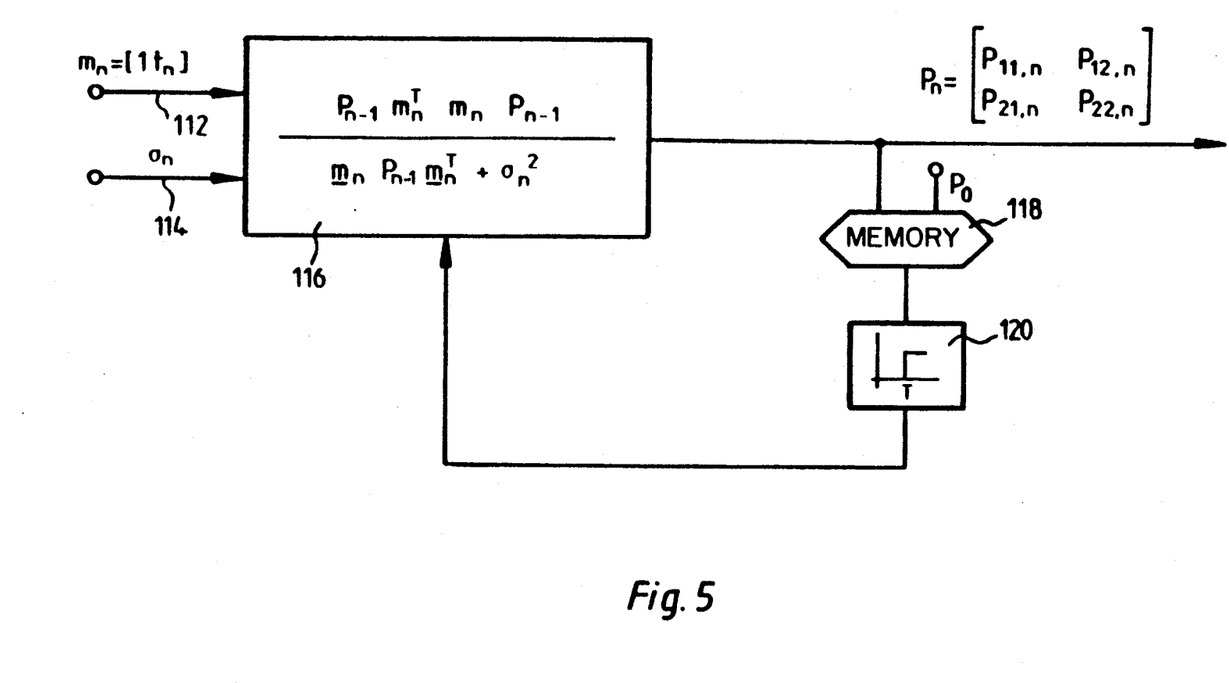
FIG. 5 illustrates the generation of the time-variant filter parameters.

The generation of the time-variant filter parameters is illustrated in FIG. 5. A vector $$\underline{m}_n = [1 \, t_n]$$

is supplied to an input 112. The variance of the noise is supplied to an input 114. From this, the matrix $P_n$ of the filter parameters is recurrently formed according to the relation $$\frac{P_{n-1} m_n^T m_n P_{n-1}}{m_n P_{n-1} m_n^T + \sigma_n^2}.$$

This is illustrated by block 116. The matrix $P_n$ thus formed is stored in a memory 118 and, with delay of one clock interval, illustrated by block 120, is available for the recurrent forming of the next value of the matrix according to block 116. The matrix thus recurrently formed is applied to the optimal filter 54 (FIG. 4) and there determines the factors illustrated by the blocks 66, 72, 88 and 94.

A further modification of the filter will now be described with reference to the FIGS. 7 to 10.

Figure 7:
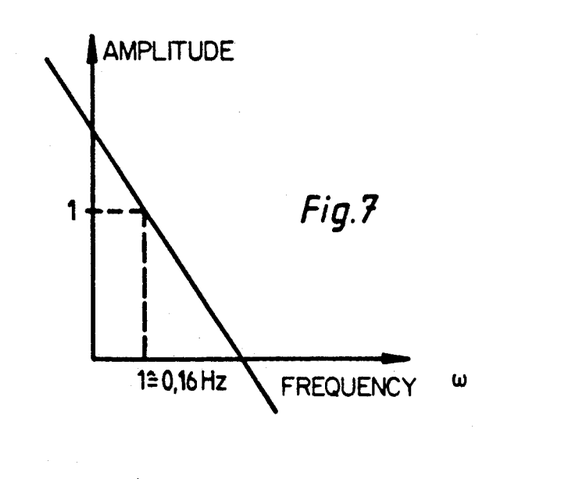
FIG. 7 shows in log-log illustration the effect of an integration on the amplitude of a signal.
Figure 8:
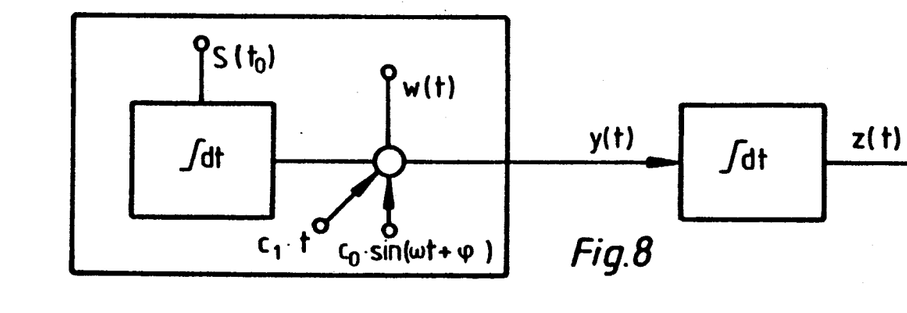
FIG. 8 shows a more sophisticated signal process model after the integration, similar to FIG. 2, which takes into account an additional ramp in the measuring signal for very low frequency noise.

The influence of the integration on the amplitude of a harmonic component of the measuring signal as a function of the angular frequency, that means in a way the degree of amplification depending on the frequency, is illustrated in FIG. 7 in log-log illustration. It can be seen that this "degree of amplification" is higher than 1 below an angular frequency of 1, that is a frequency of 0.16 Hz. Therefore, very low frequency noise would be amplified by the integration. In order to take this amplification of very low frequency noise into account, the signal process model is supplemented with a ramp function $c_1 t$ in the embodiment of the filter illustrated in FIGS. 8 to 10. This is illustrated in FIG. 8. This ramp function corresponds to a slow variation of the measuring signal and thus approximates very low frequency noise. Then, $$z(t) = a_0 + a_1 t + a_2 t^2 + v(t)$$

results as integrated measuring signal by the integration.

Figure 9:
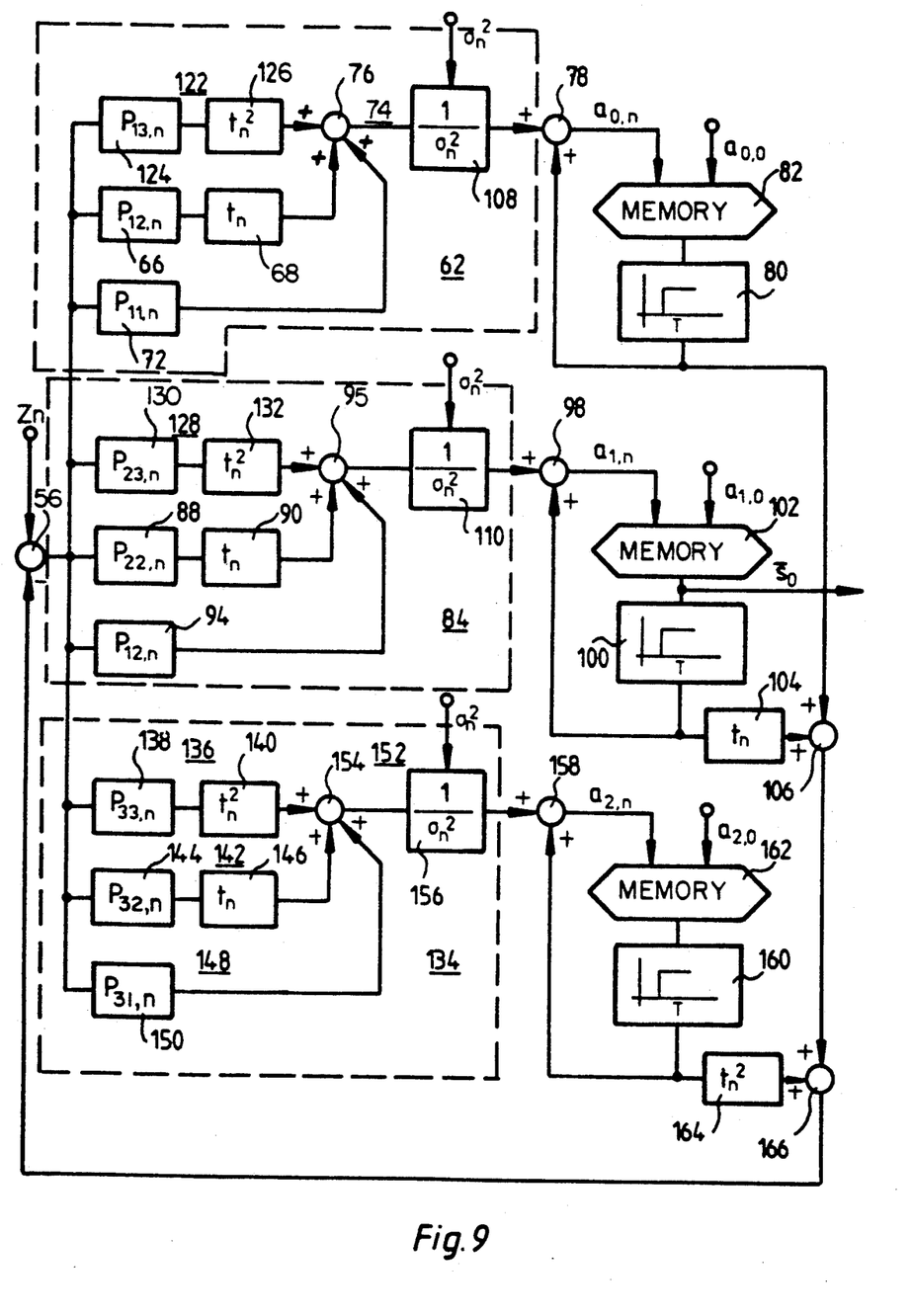
FIG. 9 shows a third type of the realization of the filter with a filter of discrete values in time of the type of FIG. 4, in which the signal process model according to FIG. 8 is taken as a basis.

The optimal filter of FIG. 9 is based on this signal process model. For the rest, corresponding elements are designated by the same numerals in FIGS. 8 and 9 as in FIGS. 2 and 4.

As compared to the optimal estimator of FIG. 9 the first channel 62 additionally comprises means 122 for multiplying the difference of integrated measuring signal and estimate of the integrated measuring signal by a fifth time-variant factor $P_{13;n}$, illustrated by block 122, and the square of the time $t_n^2$ of the clock interval concerned, as illustrated by block 124. The product likewise is applied to the means 74 for forming the variation signal representing a variation of the zero coefficient. Furthermore, the second channel 96 additionally comprises means 128 for multiplying the difference of integrated measuring signal and estimate of the integrated measuring signal by a sixth time-variant factor $P_{23;n}$, illustrated by block 130, and the square of the time $t_n^2$ of the clock interval concerned, illustrated by block 132. The product likewise is applied to the means 84 for forming the variation signal representing a variation of the first coefficient.

Finally, the optimal estimator 54 comprises a third channel 134. The third channel 134 comprises means 136 for multiplying the difference of integrated measuring signal and estimate of the integrated measuring signal by a seventh time-variant factor $P_{33;n}$, illustrated by block 138, and the square of the time $t_n^2$ of the concerned clock interval, illustrated by block 140. Furthermore, the third channel 134 comprises means 142 for multiplying the difference of integrated measuring signal and estimate of the integrated measuring signal by an eighth time-variant factor $P_{23;n}$, illustrated by block 144, and the time $t_n$ of the clock interval concerned, illustrated by block 146. Furthermore, the third channel 134 comprises means 148 for multiplying the difference of integrated measuring signal and estimate of the integrated measuring signal by a seventh time-variant factor $P_{13;n}$, illustrated by block 150. Means for adding the three products thus obtained and forming a second variation signal representing a variation of a second coefficient are also provided in the third channel as in the other channels. These means comprise a summing point 154 and means 156 for dividing the obtained sum by the variance of the measuring noise.

Likewise, as in the other channels 62 and 96, second adding means 158 are provided to which the second variation signal thus obtained is applied as one summand, and the contents of a fourth memory 162 is applied as the other summand with delay of one clock interval, illustrated by block 160. The output of the second adding means 158 is adapted to be read into the fourth memory 162. The content of the fourth memory 162 delayed by one clock interval forms the second coefficient $a_2$ of the model.

Finally, the third channel 134 comprises means 164 for multiplying said second coefficient $a_2$ by the square of the time $t_n$ of the clock interval concerned.

The outputs of the first and the second channels 62 and 84, respectively, are added at the summing point 106. Then also the the output of the third channel 134 is added thereto at a further summing point 166. Thereby an estimate of the integrated measuring signal results. An estimate $S_o$ for the useful signal is obtained from the memory 82. This estimate corresponds to the first coefficient.

Figure 10:
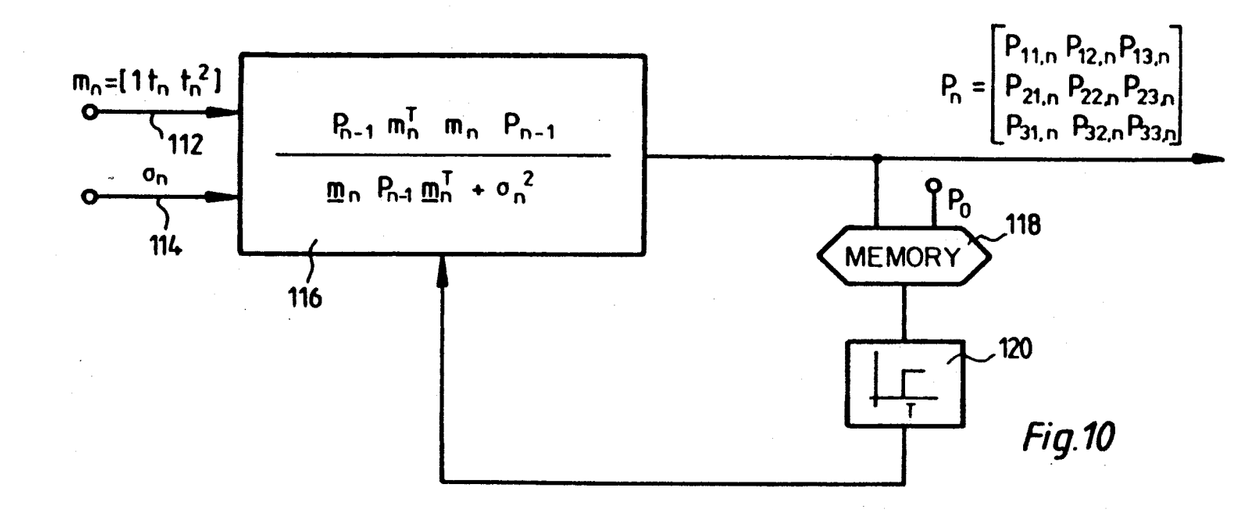
FIG. 10 illustrates the generation of the time-variant filter parameters in an illustration similar to FIG. 5 for the filter of FIG. 8.

FIG. 10 illustrates the generation of the time-variant filter parameters. Now there are nine filter parameters which are included in a matrix $P_n$. According to the embodiment of FIGS. 9 and 10 the matrix $P_n$ has three lines and three columns. In FIG. 9 the elements of the matrix $P_n$ are illustrated by the blocks 72, 66, 124; 94, 88, 130; 150, 144, 138.

The generation of the filter parameters is effected in the same way as in the embodiment of FIG. 5. Corresponding elements are designated by the same numerals as there. Though, the vector m here comprises three components $$\underline{m} = [1 \, t_n \, t_n^2]$$

and the matrices all have three lines and three columns.

Figure 6:
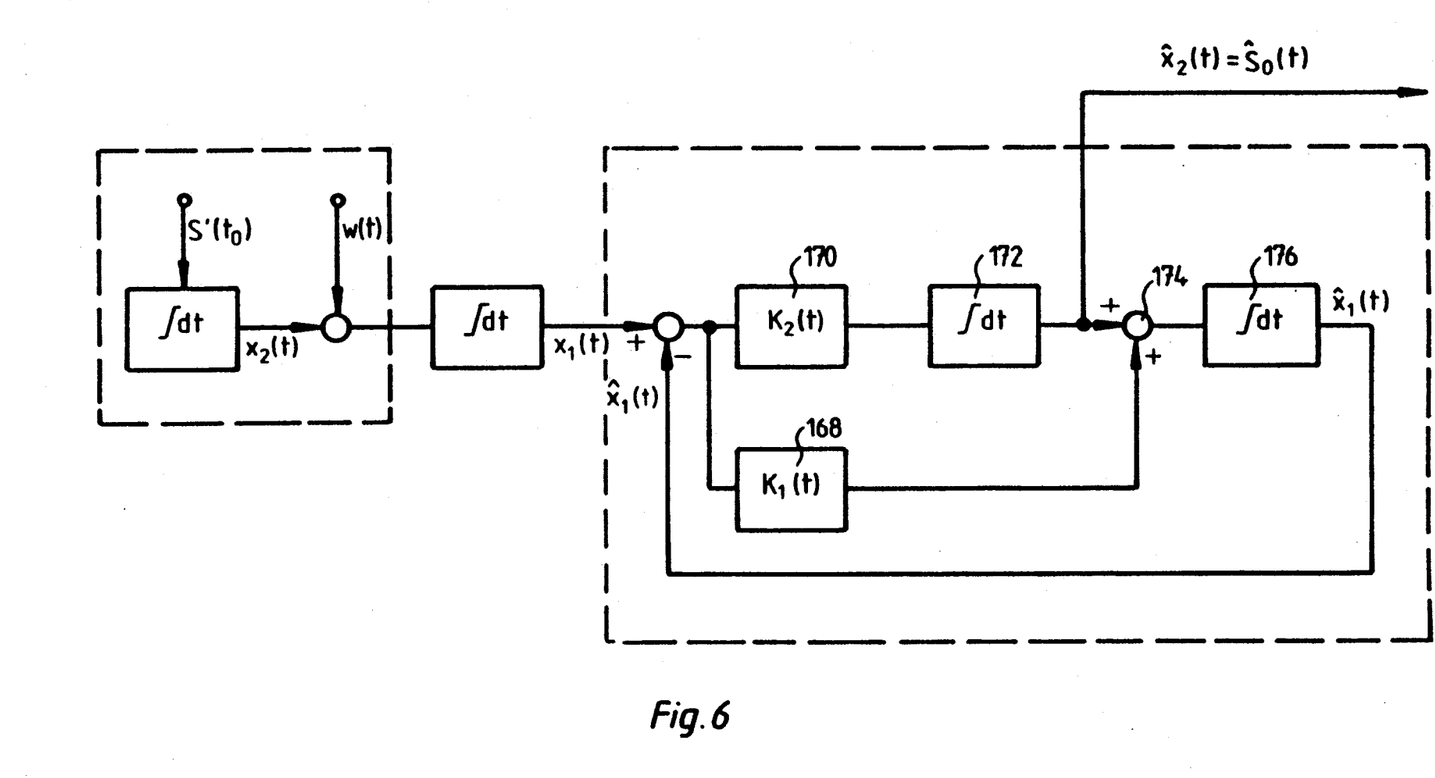
FIG. 6 shows an alternative realization of the filter.

FIG. 6 shows another embodiment of the optimal filter.

The optimal filter is a Kalman filter. The difference of integrated measuring signal and estimate of the integrated measuring signal is multiplied with a first time-variant function $K_1(t)$, illustrated by a block 168. Furthermore, the difference of integrated measuring signal and estimate of the integrated measuring signal is multiplied with a second time-variant function $K_2(t)$, illustrated by a block 170 and integrated with respect to time by first integrating means (172). The quantities thus formed are added by adding means 174. The sum thus formed is integrated by second integrating means 176 for forming said estimate of the integrated measuring signal. The output of the first integrating means 172 provides the estimate of the useful signal.

For the rest the signal process model and the integration of the measuring signal are exactly like those in FIG. 2. Corresponding elements are designated by the same numerals as there.

A filter of the described type can, for example, be used in a tape suspended restrained meridian gyro for filtering the restraining signals indicating the angle between instrument reference and North. Such a meridian gyro having a filter which can be constructed like filter described above disclosed in the patent application "Filter Arrangement for Generating an Estimate of a Measured Variable Influenced by Disturbances" mentioned hereinbefore.

In this application a value can be set as initial value $a_{1;0}$ for the coefficient, which value results from the usual pre-alignment of the meridian gyro. This value is input into the memory 102. Nothing is known about the initial values of the other coefficents. These initial values are suitably input into the memories 82 and 162. When generating the filter parameters $P_{i,k}$ a matrix $P_o$ is input in the memory 118. This is a diagonal matrix in the diagonal of which the variances are located in the knowledge of the initial values of the coefficients $a_{o,0}$, $a_{1,0}$ and $a_{2,0}$. None of these diagonal elements are allowed to be set to zero. Thus, it is:

$$P_o = \begin{bmatrix} \sigma_{a0}^2 & 0 & 0 \\ 0 & \sigma_{a1}^2 & 0 \\ 0 & 0 & \sigma_{a2}^2 \end{bmatrix}$$

I claim:

1. A filter apparatus for providing a useful signal constant with respect to time from a measuring signal including measuring noise, comprising:
   (a) means for integrating a measuring signal with respect to time and thereby providing an integrated measuring signal;
   (aa) said means for integrating the measuring signal including
      (1) a voltage-to-frequency converter,
      (2) clock means for generating clock intervals,
      (3) an accumulator to which the output signals from the voltage-to-frequency converter are applied and which is resettable at predetermined clock intervals,
      (4) a first memory for storing the integrated measuring signal,
      (5) adding means to which, in said predetermined clock intervals, the content of the accumulator is applied as one summand, and the contents of said first memory is applied as another summand with a delay of one clock interval, and
      (6) the output of the adding means being read into the first memory and constituting the digitized integrated measuring signal;
   (b) said integrated measuring signal containing a component varying substantially linearly with time with a predetermined coefficient which represents the useful signal;
   (c) filtering means for generating output signals indicative of a preselected, variable model which represents an estimate of said integrated measuring signal and an estimate of a first order coefficient of the linearly time-variable component of the estimate of said integrated measuring signal corresponding to the time-constant useful signal;
   (d) said filtering means including
      means for multiplying the difference of the integrated measuring signal and the estimate of the integrated measuring signal by a first time-variant factor and the time of a concerned clock interval,
      means for multiplying the difference of the integrated measuring signal and the estimate of the integrated measuring signal by a second time-variant factor,
      means for adding the two products thus obtained and for forming a zero variation signal representing a variation of a zero order coefficient of the model,
      a second memory for storing the zero order coefficient of the model,
      zero adding means to which the zero variation signal thus obtained is applied as one summand, and the contents of the second memory is applied as an other summand with a delay of one clock interval, in order to thereby obtain the zero order coefficient of the model, and
      the output of the zero adding means being read into the second memory for storing in the second memory the zero order coefficient of the model;
   (e) said filtering means further including
      means for multiplying the difference of the integrated measuring signal and the estimate of the integrated measuring signal by a third time-variant factor and the time of said concerned clock interval,
      means for multiplying the difference of the integrated measuring signal and the estimate of the integrated measuring signal by a fourth time-variant factor,
      means for adding the two products thus obtained and forming a first variation signal representing a variation of a first order coefficient of the model,
      a third memory for storing the first order coefficient of the model,
      first adding means to which the first variation signal thus obtained is applied as one summand and the contents of the third memory is applied as another summand with a delay of one clock interval, in order to thereby obtain the first order coefficient of the model,
      the output of the first adding means being read into said third memory, the contents of the third memory delayed by one clock interval forming the first coefficient of a model, and
      means for multiplying said first order coefficient by the time of said concerned clock interval;
   (f) means for adding the zero order coefficient and the first order coefficient multiplied by the time of said concerned clock interval for forming the estimate of said integrated measuring signal; and
   (g) said first order coefficient providing the estimate of the time-constant useful signal.

2. A filter as set forth in claim 1, wherein the means for forming the zero variation signal and the means for forming the first variation signal comprise respective means for dividing the sums of the two products obtained from the respective adding means by the variance of the measuring noise.

3. A filter as set forth in claim 1, wherein
   (a) said filtering means further comprises means for multiplying the difference of said integrated measuring signal and said estimate of the integrated measuring signal by a fifth time-variant factor and the square of the time of said clock interval concerned, and for applying the thus obtained product to said means for forming the zero variation signal representing the variation of the zero order coefficient, and, (b) said filtering means additionally comprises means for multiplying the difference of said integrated measuring signal and said estimate of the integrated measuring signal by a sixth time-variant factor and the square of the time of said clock interval concerned, and for applying the thus obtained product to said means for forming the first variation signal representing the variation of the zero order coefficient, (c) the filtering means including means for multiplying the difference of said integrated measuring signal and said estimate of the integrated measuring signal by a seventh time-variant factor and the square of the time of the clock interval concerned, means for multiplying the difference of said integrated measuring signal and said estimate of the integrated measuring signal by an eighth time-variant factor and the time of of the clock interval concerned, means for multiplying the difference of said integrated measuring signal and said estimate of the integrated measuring signal by a ninth time-variant factor, means for adding the three products thus obtained and for forming a second variation signal representing a variation of a second order coefficient of the model, a fourth memory for storing the second order coefficient of the model, second adding means to which the second variation signal thus obtained is applied as one summand, and the contents of the fourth memory is applied as an other summand with a delay of one clock interval, in order to thereby obtain the second order coefficient of the model, the output of the second adding means being read into the fourth memory and the contents of the fourth memory delayed by one clock interval forming the second order coefficient of the model, and means for multiplying said second order coefficient by the square of the time of said clock interval concerned.

* * * * *